US008916920B2

(12) United States Patent
Huang et al.

(10) Patent No.: US 8,916,920 B2
(45) Date of Patent: Dec. 23, 2014

(54) MEMORY STRUCTURE WITH PLANAR UPPER SURFACE

(75) Inventors: Yu-Fong Huang, Hsinchu (TW); Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/186,095

(22) Filed: Jul. 19, 2011

(65) Prior Publication Data
US 2013/0020624 A1  Jan. 24, 2013

(51) Int. Cl.
H01L 29/76 (2006.01)
H01L 27/115 (2006.01)

(52) U.S. Cl.
CPC .... H01L 27/11531 (2013.01); H01L 27/11548 (2013.01)
USPC ............................ 257/314; 257/324; 257/510

(58) Field of Classification Search
CPC ........................................................ H01L 29/788
USPC ............................................ 257/314, 324, 510
See application file for complete search history.

(56) References Cited

U.S. PATENT DOCUMENTS

| 5,300,799 | A | * | 4/1994 | Nakamura et al. | 257/295 |
| 5,350,937 | A | * | 9/1994 | Yamazaki et al. | 257/316 |
| 5,414,287 | A | * | 5/1995 | Hong | 257/316 |
| 5,432,739 | A | * | 7/1995 | Pein | 365/185.11 |
| 5,460,988 | A | * | 10/1995 | Hong | 438/259 |
| 5,949,101 | A | * | 9/1999 | Aritome | 257/315 |
| 6,093,606 | A | * | 7/2000 | Lin et al. | 438/259 |
| 6,133,601 | A | * | 10/2000 | Watanabe | 257/314 |
| 6,137,132 | A | * | 10/2000 | Wu | 257/315 |
| 6,157,060 | A | * | 12/2000 | Kerber | 257/316 |
| 6,303,436 | B1 | * | 10/2001 | Sung | 438/257 |
| 6,486,028 | B1 | * | 11/2002 | Chang et al. | 438/259 |
| 6,670,246 | B1 | * | 12/2003 | Hsiao et al. | 438/276 |
| 6,768,166 | B2 | * | 7/2004 | Hagemeyer | 257/324 |
| 6,885,060 | B2 | * | 4/2005 | Nomoto et al. | 257/324 |
| 6,894,930 | B2 | * | 5/2005 | Chien et al. | 365/185.17 |
| 6,969,884 | B2 | * | 11/2005 | Kitamura et al. | 257/315 |
| 7,151,295 | B2 | * | 12/2006 | Yaegashi et al. | 257/316 |
| 7,442,988 | B2 | * | 10/2008 | Oh et al. | 257/321 |
| 7,569,879 | B2 | * | 8/2009 | Kinoshita et al. | 257/314 |
| 7,786,524 | B2 | * | 8/2010 | Hazama | 257/316 |
| 7,795,667 | B2 | * | 9/2010 | Iguchi et al. | 257/316 |
| 7,816,725 | B2 | * | 10/2010 | Oh et al. | 257/324 |
| 7,825,439 | B2 | * | 11/2010 | Izumi et al. | 257/241 |

(Continued)

FOREIGN PATENT DOCUMENTS

TW  200644180  12/2006
TW  201021201  6/2010

OTHER PUBLICATIONS

"Office Action of Taiwan counterpart application" issued on Dec. 31, 2013, p. 1- p.5.

Primary Examiner — Caleb Henry
(74) Attorney, Agent, or Firm — J.C. Patents

(57) ABSTRACT

A memory structure having a memory cell region and a non-memory cell region is provided. The memory structure includes a plurality of memory cells and a conductive material. The plurality of memory cells are disposed in the memory cell region, wherein a plurality of first concave portions are present in the plurality of memory cells. The conductive material extends across the memory cell region and the non-memory cell region, covers the plurality of memory cells, and extends into the plurality of first concave portions.

19 Claims, 6 Drawing Sheets

(56) References Cited

U.S. PATENT DOCUMENTS

| | | | |
|---|---|---|---|
| 7,948,021 B2* | 5/2011 | Maekawa | 257/316 |
| 8,068,370 B2* | 11/2011 | Lue | 365/185.28 |
| 8,212,303 B2* | 7/2012 | Sakamoto | 257/314 |
| 8,289,782 B2* | 10/2012 | Izumida et al. | 365/185.28 |
| 2004/0031984 A1* | 2/2004 | Kianian et al. | 257/314 |
| 2004/0232471 A1* | 11/2004 | Shukuri | 257/314 |
| 2007/0122979 A1* | 5/2007 | Oh et al. | 438/261 |
| 2008/0116506 A1* | 5/2008 | Lue | 257/324 |
| 2009/0057814 A1* | 3/2009 | Izumi et al. | 257/510 |
| 2010/0244117 A1* | 9/2010 | Prall et al. | 257/316 |
| 2011/0024825 A1* | 2/2011 | Izumi et al. | 257/324 |
| 2012/0061742 A1* | 3/2012 | Maekawa | 257/314 |
| 2012/0161222 A1* | 6/2012 | Huang et al. | 257/324 |

\* cited by examiner

MEMORY STRUCTURE WITH PLANAR UPPER SURFACE

BACKGROUND OF THE INVENTION

1. Technical Field

The embodiments of the invention generally relate to a semi-conductor element, in particular, to a memory structure which could avoid word line opening or linewidth necking.

2. Background

Memory cells are semiconductor elements used for storing information or data, and are widely applied to computers or electronic apparatus. Since the functions of micro processors have become stronger, demands for various types of memory have also been increased. According to different requirements of memory types, different structural designs of memory have been provided, such as a vertical-channel memory (VC memory) with a vertical channel structure, a floating-gate memory (FG memory) with a oxide recess structure, and a 3D memory with a thin film-stacked structure, etc.

In a general memory layout, a word line strides across an active region, that is, a device-concentrated region wherein a plurality of memory cells are disposed, which also could be called a memory cell region. Usually, in the front end process of semiconductor devices, the structural design of memory cells results in a larger step difference at the boundary of the conductive layer used to form word lines and the device-concentrated region. The step difference leads to a defocus phenomenon in a later lithography process for patterning a conductive layer, so that the word line formed in such process may have word line opening or necking issues. Therefore, the quality and efficiency of production get lower. With the miniaturization of semiconductor devices, an appropriate solution to the problem is required.

SUMMARY OF THE INVENTION

According to an embodiment of the invention, a memory structure is provided. The memory structure can avoid word line opening or linewidth necking and improve the quality of production of memory devices.

According to an embodiment of the invention, a memory structure is provided, which has a memory cell region and a non-memory cell region. The memory structure comprises a plurality of memory cells and a conductive material. The plurality of memory cells are disposed in the memory cell region, wherein a plurality of first concave portions are present in the plurality of memory cells. The conductive material extends across the memory cell region and the non-memory cell region, covers the plurality of memory cells and extends into the plurality of first concave portions.

According to an embodiment of the invention, the conductive material has a substantially planar upper surface in the memory cell region and the non-memory cell region.

According to an embodiment of the invention, a ratio of height variation to linewidth of the substantially planar upper surface of the conductive material in the memory cell region and the non-memory cell region is 0-1.0.

According to an embodiment of the invention, the ratio of height variation to linewidth of the substantially planar upper surface of the conductive material in the memory cell region and the non-memory cell region is 0-0.5.

According to an embodiment of the invention, a height variation of the substantially planar upper surface of the conductive material in the memory cell region and the non-memory cell region is 0 Å-300 Å.

According to an embodiment of the invention, the non-memory cell region is a semi-isolated region.

According to an embodiment of the invention, the non-memory cell region is a dummy memory cell region, further comprising a plurality of dummy structures disposed in the dummy memory cell region, wherein a plurality of second concave portions are interposed between two adjacent dummy structures, and a bottom of the plurality of second concave portions and a bottom of the plurality of first concave portions are substantially at a same height level and with substantially the same depth.

According to an embodiment of the invention, a distance between two adjacent second concave portions substantially equals to a distance between two adjacent first concave portions.

According to an embodiment of the invention, the plurality of memory cells are vertical-channel memory cells, floating-gate memory cells or 3D memory cells.

According to another embodiment of the invention, a memory structure is provided, which has a memory cell region and a non-memory cell region. The memory structure comprises a plurality of memory cells and a word line. The plurality of memory cells are disposed in the memory cell region, wherein a non-coplanar dielectric structure is present in the plurality of memory cells. The word line extends across the memory cell region and the non-memory cell region, covers the plurality of memory cells, wherein the word line has a substantially planar upper surface and a non-coplanar bottom surface connected to the non-coplanar dielectric structure in the memory cell region and the non-memory cell region.

According to an embodiment of the invention, the ratio of height variation to linewidth of the substantially planar upper surface of the word line in the memory cell region and the non-memory cell region is 0-1.0.

According to an embodiment of the invention, the ratio of height variation to linewidth of the substantially planar upper surface of the word line in the memory cell region and the non-memory cell region is 0-0.5.

According to an embodiment of the invention, the height variation of the substantially planar upper surface of the word line in the memory cell region and the non-memory cell region is 0 Å-300 Å.

According to an embodiment of the invention, the non-memory cell region is a semi-isolated region.

According to an embodiment of the invention, the non-coplanar dielectric structure comprises a plurality of first surfaces and a plurality of second surfaces, and the plurality of first surfaces are higher than the plurality of second surfaces.

According to an embodiment of the invention, the non-memory cell region is a dummy memory cell region, further comprising a plurality of dummy structures disposed in the dummy memory cell region, wherein upper surfaces of the plurality of dummy structures and the plurality of first surfaces are substantially at a same height level.

According to an embodiment of the invention, a distance between two adjacent dummy structures substantially equals to a distance between two adjacent first surfaces.

According to a further embodiment of the invention, the plurality of memory cells are vertical-channel memory cells, floating-gate memory cells or 3D memory cells.

In the memory structure of the embodiments of the invention, since the word line in the memory cell region and the non-memory cell region has a substantially planar upper surface, issues of word line opening and linewidth necking are prevented. In addition, the memory structures of the embodiments of the invention can be applied to different types of memory elements to improve the quality and the efficiency in the production of semiconductor memory devices.

In order to make the aforementioned features and advantages of this invention comprehensible, embodiments of the invention accompanied with figures are described in detail below.

DESCRIPTION OF THE EMBODIMENTS

The embodiments of the invention will be fully described in detail along with the accompanying drawings in the following sections. However, the invention may be embodied by various forms, and is not limited to the embodiments described herein. Terms of orientation such as "on", etc., in the following embodiments are only provided for reference to the accompany drawings; therefore, the terms of orientation are used for detailed description instead of limiting the invention. Besides, for clarity, the size and relative size of each layer in the accompany drawings may be exaggeratedly illustrated.

FIGS. 1A-1D are cross-sectional views illustrating a manufacturing process of a memory structure according to an embodiment of the invention. A vertical-channel memory is taken as an example to describe the memory structure in the embodiment.

Figure 1A:
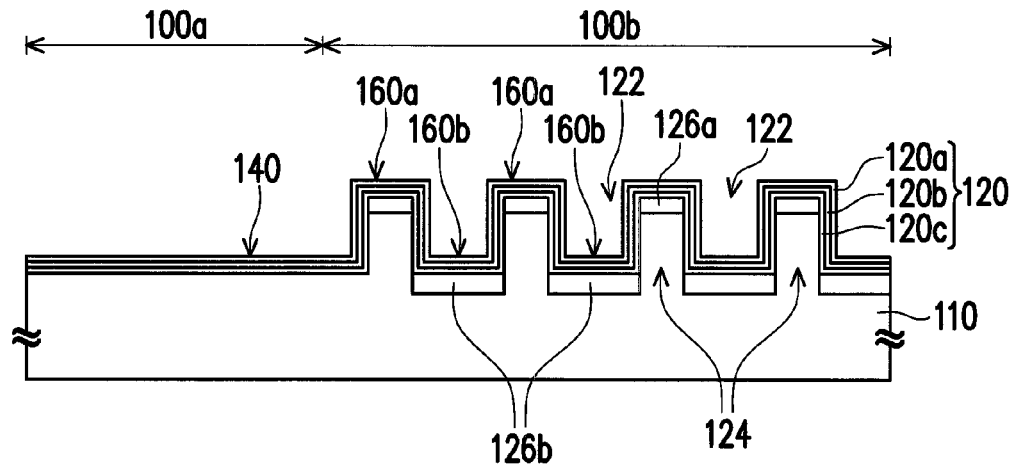
FIGS. 1A-1D are cross-sectional views illustrating a manufacturing process of a memory structure according to an embodiment of the invention.

Referring to FIG. 1A, a substrate 110 is provided, which could be divided into a non-memory cell region 100a and a memory cell region 100b. In the embodiment, the non memory cell region 100a, for example, is a semi-isolated region, and there is no memory cell in the semi-isolated region. In addition, a plurality of protrusion parts 124 is already formed on the substrate 110 in the memory cell region 100b. In the memory cell region 100b, the substrate 110 may further have a plurality of first doped regions 126a and a plurality of second doped regions 126b, wherein the first doped regions 126a are disposed in the upper portion of the protrusion parts 124, and the second doped regions 126b are disposed in the substrate 110 at the bottoms between two adjacent protrusion parts 124.

Then, a dielectric structure 120 is formed on the substrate 110, possibly by sequentially forming a bottom dielectric layer 120c, a charge-trapping layer 120b and a top dielectric layer 120a through chemical vapor deposition (CVD). The material of the bottom dielectric layer 120c and the top dielectric layer 120a is, for example, silicon oxide. The material of the charge-trapping layer 120b is, for example, silicon nitride.

Since the dielectric structure 120 is formed on the substrate 110 with the protrusion parts 124, the dielectric structure 120 in the memory cell region 100b has a plurality of concave portions 122 so that a non-coplanar structure is formed. The non-coplanar dielectric structure 120 has, for example, a plurality of first surfaces 160a and a plurality of second surfaces 160b, wherein the first surfaces 160a are higher than the second surfaces 160b in the vertical direction.

Figure 1B:
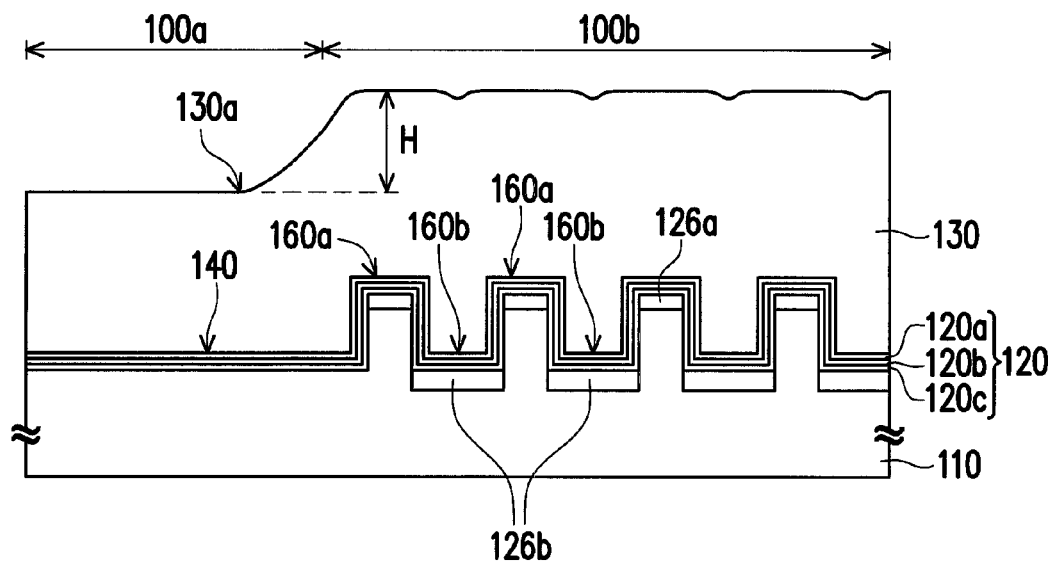

Referring to FIG. 1B, a conductive layer 130 is then formed on the dielectric structure 120. The material of the conductive layer 130 is, for example, doped poly-silicon.

Since the first surfaces 160a of the non-coplanar dielectric structure 120 in the memory cell region 100b are higher than the upper surfaces 140 of the same in the non-memory cell region 100a in the vertical direction, after the deposition of the conductive layer 130 used to form word lines, the heights of the upper surface 130a of the conductive layer 130 in the non-memory cell region 100a and in the memory cell region 100b are different, and a step difference H is generated as shown in FIG. 1B.

Figure 1C:
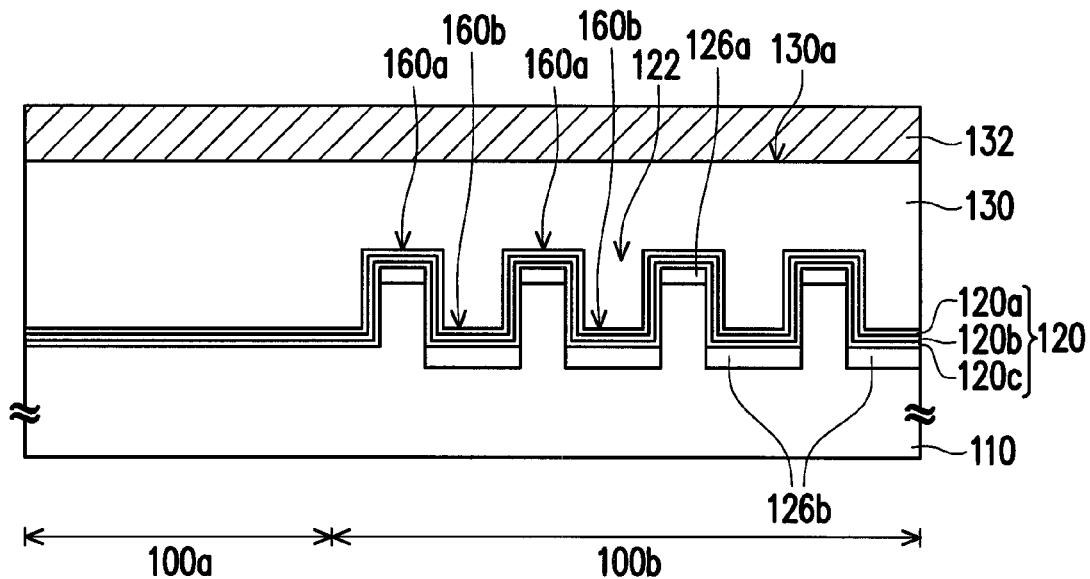

Referring to FIG. 1C, a chemical mechanical polishing (CMP) process is performed to the conductive layer 130, such that the upper surface 130a of the conductive layer 130 becomes much flatter and the step difference H is eliminated.

Since the step difference H is eliminated, light defocusing can be avoid in the later photolithography process for patterning the conductive layer, and word line opening and linewidth necking can also be prevented.

Then, a metal silicide layer 132 may be optionally formed on the conductive layer 130, thereby lowering the resistance of word lines formed in following processes. The material of the metal silicide layer 132 is, for example, tungsten silicide (WSi). The metal silicide layer 132 is formed by, for example, a salicide process.

Figure 1D:
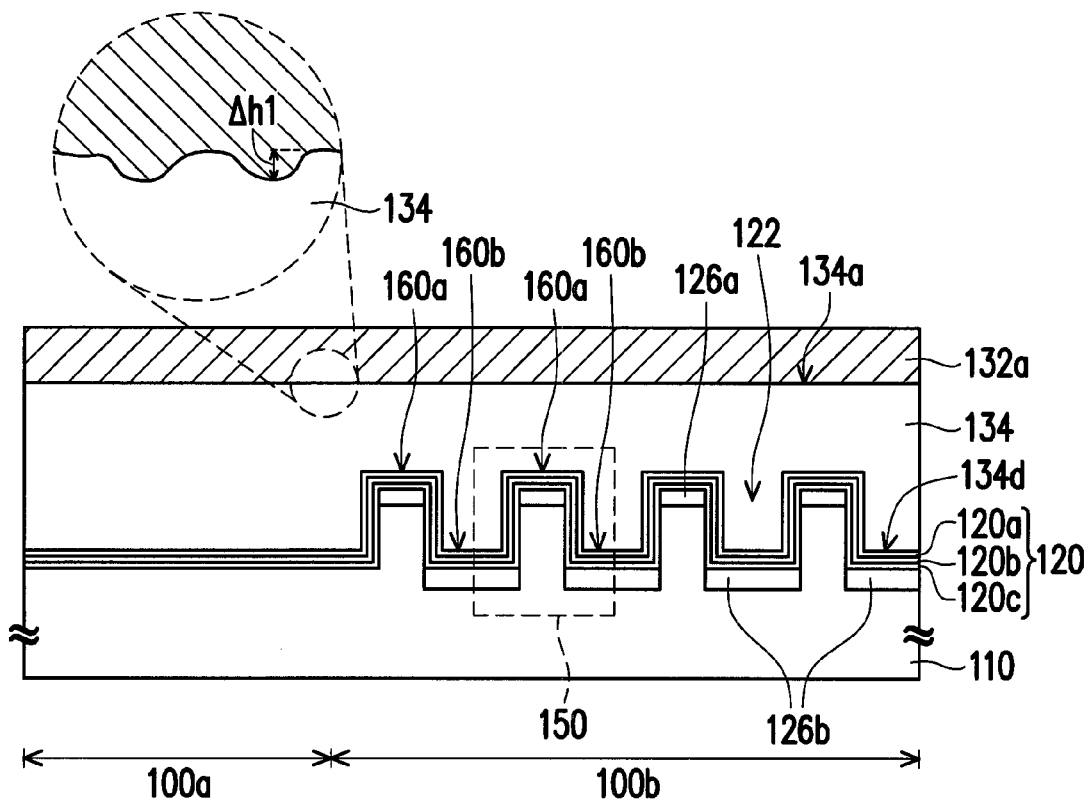

Referring to FIG. 1D, a patterning process is then performed to the metal silicide layer 132 and the conductive layer 130 to form a patterned metal silicide layer 132a and a word line 134. The patterning process includes, for example, a lithography process and a subsequent etching process. Though the word line 134 is formed by the above method in the embodiment, its forming method is not limited thereto.

It is noted that by applying CMP to the conductive layer 130 in the process, the upper surface 130a of the conductive layer 130 become much flatter. Therefore, light defocusing is avoided in the lithography process for patterning the conductive layer 130, and breaking or linewidth necking of the resulting word line 134 can be prevented.

Figure 1E:
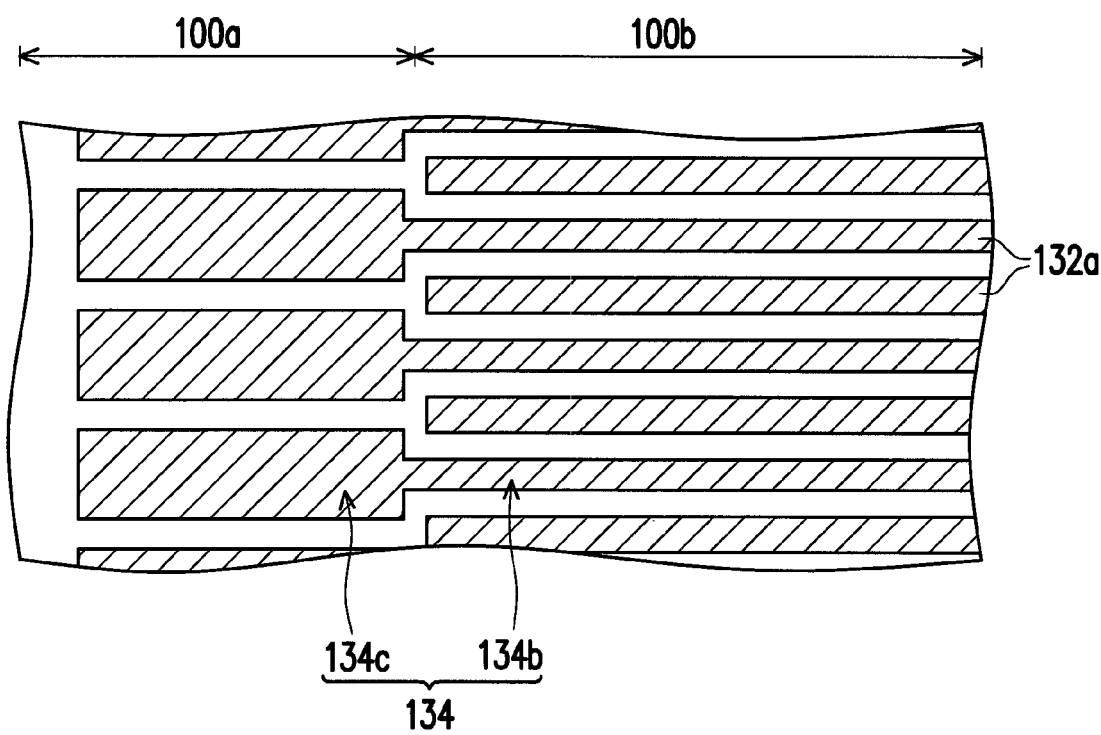
FIG. 1E is a plan view of the memory structure illustrated in FIG. 1D according to an embodiment of the invention.

FIG. 1E is a plan view of the memory structure illustrated in FIG. 1D according to the embodiment of the invention. Hereinafter, the memory structure set out in above embodiments will be described by reference to FIGS. 1D and 1E.

Referring to FIG. 1D, the memory structure can be divided into a memory cell region 100b and a non-memory cell region 100a. In the embodiment, the non memory cell region 100a is, for example, a semi-isolated region, and there is no memory cell in the semi-isolated region. A plurality of memory cells 150 is disposed in the memory cell region 100b, and a non-coplanar dielectric structure 120 is present in the memory cells 150. The non-coplanar dielectric structure 120 has, for example, a plurality of first surfaces 160a and a plurality of second surfaces 160b, wherein the first surfaces 160a are higher than the second surfaces 160b in the vertical direction. In addition, the memory structure further comprises a word line 134, which extends across the memory cell region 100b and the non-memory cell region 100a, covers the plurality of memory cells 150 and extending into concave portions 122. In addition, the word line 134 has a substantially planar upper surface 134a and a non-coplanar bottom surface 134d connected to the non-coplanar dielectric structure 120 in the memory cell region 100b and the non-memory cell region 100a. The materials, configuration, forming methods and effects of other components in the memory structure have already been described as above in details and are omitted here.

Further, the flatness (or planarity) of the upper surface 134a of the word line 134 may be defined by the ratio of the height variation Δh1 to the linewidth of the word line 134 on the upper surface 134a of the word line 134. The ratio is, for example, 0-1.0, or 0-0.5. In addition, the height variation Δh1 of the upper surface 134a is, for example, in the range of 0 Å-300 Å.

Meanwhile, referring to FIG. 1E, the word line 134 comprises a word line head 134c and a word line body 134b, wherein the linewidth of the word line head 134c is larger than that of the word line body 134b. In addition, a patterned metal silicide layer 132a may optionally cover the word line 134 to lower its resistance. The material of the metal silicide layer 132a is, for example, tungsten silicide (WSi).

The word line head 134c is located in the non-memory cell region 100a, and the word line body 134b is located in the non-memory cell region 100a and the memory cell region 100b (the word line body 134b may also extend to the non-memory cell region 100a). The word line head 134c may be connected to an external power source (not shown) that applies voltages to the word line body 134b to operate each of the memory cells 150.

Since the word line 134 in the memory structure has a substantially planar upper surface, word line opening and linewidth necking do not easily occur.

Figure 2A:
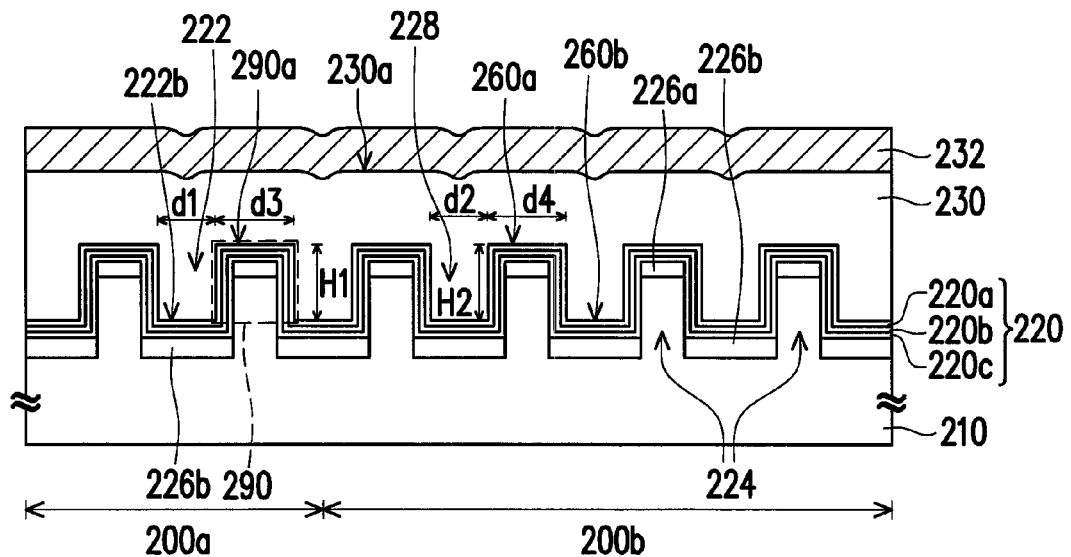
FIGS. 2A-2B are cross-sectional views illustrating a manufacturing process of a memory structure according to an embodiment of the invention.
Figure 2B:
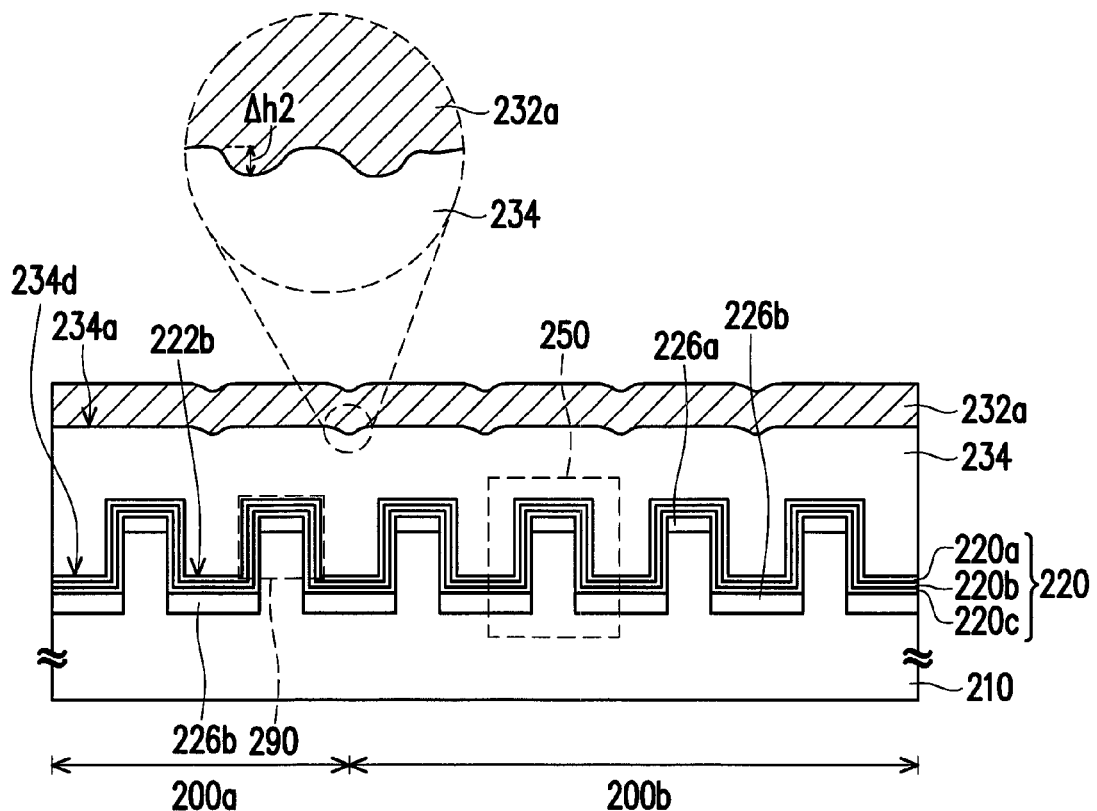

FIGS. 2A-2B are cross-sectional views illustrating a manufacturing process of a memory structure according to another embodiment of the invention. A vertical-channel memory is taken as an example to describe the memory structure in the embodiment.

Referring to FIG. 2A, a substrate 210 is provided, which can be divided into a non-memory cell region 200a and a memory cell region 200b. In the embodiment, the non memory cell region 200a is, for example, a dummy memory cell region, which is for forming dummy structures and has no operable memory cell therein.

A plurality of protrusion parts 224 is already formed on the substrate 210 in the non-memory cell region 200a and the memory cell region 200b. The substrate 210 may further have a plurality of first doped regions 226a and a plurality of second doped regions 226b, wherein the first doped regions 126a are disposed in the upper portion of the protrusion parts 224, and the second doped regions 226b are disposed in the substrate 210 at the bottoms between two adjacent protrusion parts 224.

Then, a dielectric structure 220 is formed on the substrate 210. At this moment, a plurality of dummy structures 290 is formed in the non-memory cell region 200a. The dielectric structure 220 is formed by, for example, sequentially forming a bottom dielectric layer 220c, a charge-trapping layer 220b and a top dielectric layer 220a through CVD. The material of the bottom dielectric layer 220c and the top dielectric layer 220a is, for example, silicon oxide. The material of the charge-trapping layer 220b is, for example, silicon nitride.

Since the dielectric structure 220 is formed on the substrate 210 with protrusions 224, it has a non-coplanar structure in the non-memory cell region 200a and the memory cell region 200b. The dielectric structure 220 in the memory cell region 200b has, for example, a plurality of first surfaces 260a and a plurality of second surfaces 260b, wherein the plurality of first surfaces 260a is higher than the plurality of second surfaces 260b in the vertical direction. The upper surfaces 290a of the dummy structures 290 and the first surfaces 260a are substantially at the same height level. The distance d1 between two adjacent dummy structures 290 substantially equals to the distance d2 between two adjacent first surfaces 260a.

Further, a plurality of first concave portions 228 is provided in the memory cell region 200b, and a plurality of second concave portions 222 is provided between the dummy structures 290 in the non-memory cell region 200a. The bottoms of the plurality of first concave portions 228 and those of the plurality of second concave portions 222 are substantially at the same height level and with substantially the same depth. That is, the depth H1 of each of the first concave portions 228 is substantially equal to the depth H2 of each of the second concave portions 222. In addition, the distance d3 between two adjacent second concave portions 222 substantially equals to the distance d4 between two adjacent first concave portions 228.

That is, the combination structure of the dummy structures 290 and the second concave portions 222 in the non-memory cell region 200a has substantially the same configuration as the dielectric structure 220 in the memory cell region 200b.

Then, a conductive layer 230 is formed on the dielectric structure 220. The material of the conductive layer 230 is, for example, doped poly-silicon. The conductive layer 230 is formed by, for example, CVD.

Since the combination structure of the dummy structures 290 and the second concave portions 222 in the non-memory cell region 200a has substantially the same configuration as the dielectric structure 220 in the memory cell region 200b, the heights of the upper surface 230a of the conductive layer 230 in the non-memory cell region 200a and the memory cell region 200b are substantially the same. Therefore, the aforementioned step difference is not formed.

Because the upper surface 230a of the conductive layer 230 in the non-memory cell region 200a and the memory cell region 200b is flat, light defocusing is avoided in the photolithography process for patterning the conductive layer 230, and breaking or linewidth necking of word lines can be prevented.

Then, a metal silicide layer 232 may be optionally formed on the conductive layer 230 to lower the resistance of the word lines formed in following processes. The material of the metal silicide layer 232 is, for example, tungsten silicide (WSi). The metal silicide layer 232 is formed by, for example, a salicide process.

Afterwards, referring to FIG. 2B, a patterning process is performed to the metal silicide layer 232 and the conductive layer 230 to form a patterned metal silicide layer 232a and a word line 234. The patterning process includes, for example, a lithography process and a subsequent etching process. Although the word line 234 is formed by the above method in the embodiment, its forming method is not limited thereto.

It is noted that in the embodiment, the combination structure of the dummy structures 290 and the second concave portions 222 in the non-memory cell region 200a has substantially the same configuration as the dielectric structure 220 in the memory cell region 200b, so that the upper surface 230a of the conductive layer 230 is flat after the deposition of the same and thereby breaking or linewidth necking of the resulting word line 234 can be prevented.

It is worth mentioning that, in the embodiment, though the dummy structures 290 are formed along with the memory cells 250 to have a similar structure of the memory cells 250, by the design of layout, the ability of being a memory cell is lost for the dummy structures 290. For example, when the bit lines connected to the first doped region 226a and the second doped region 226b in the dummy structures 290 are not connect to an exterior voltage source, the ability of being a memory cell is lost for the dummy structures 290. In addition, though the dummy structures 290 have a similar structure of the memory cells 250 in the embodiment, their structure is not limited thereto. As long as the combination structure of the dummy structures 290 and the second concave portions 222 has substantially the same configuration as the dielectric structure 220 in the memory cell region 200b, such embodiments fall in the scope of the invention. In addition, in other embodiments, the dummy structures 290 and the memory cells 250 are not required to be formed at the same time, and the dummy structures 290 may be formed by other independent processes.

Figure 2C:
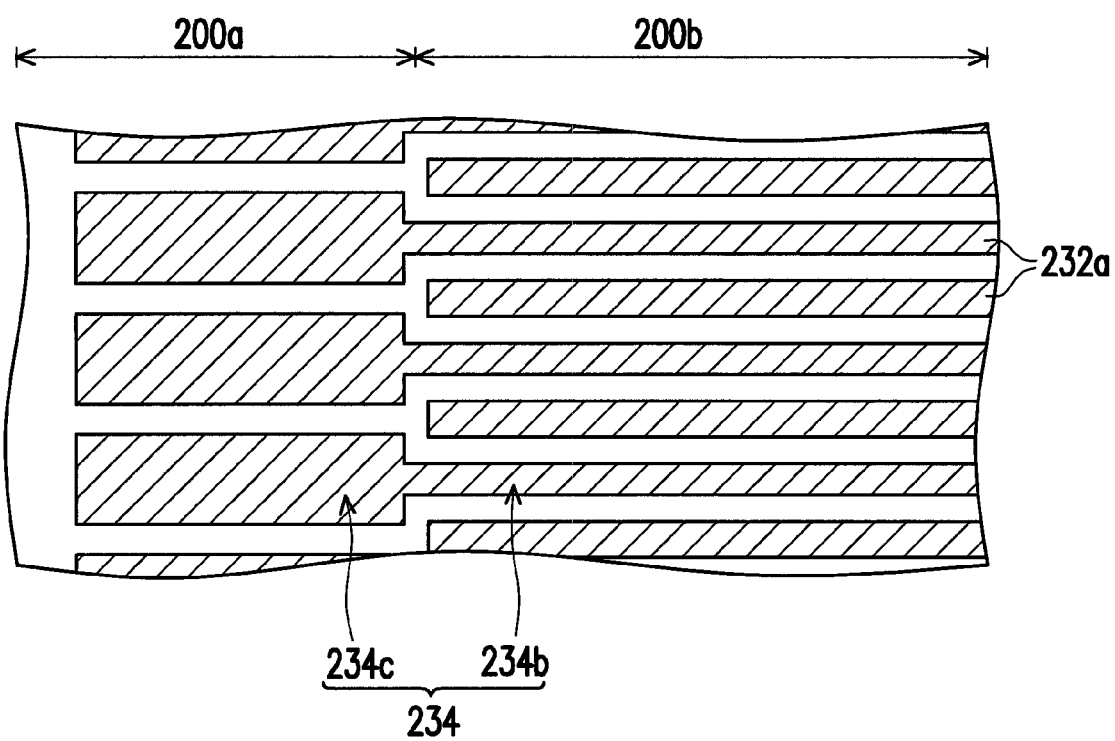
FIG. 2C is a plan view of the memory structure illustrated in FIG. 2B according to an embodiment of the invention.

FIG. 2C is a plan view of the memory structure illustrated in FIG. 2B according to another embodiment of the invention. Hereinafter, the memory structure set out in the above embodiment is described by reference to FIGS. 2B and 2C.

Referring to FIG. 2B, the memory structure in the embodiment is divided into a memory cell region 200b and a non-memory cell region 200a. In the embodiment, the non-memory cell region 200a is a dummy region with a plurality of dummy structures 290 disposed therein. The plurality of the memory cells 250 is disposed in the memory cell region 200b. The memory structure comprises a dielectric structure 220 disposed on the substrate 210. The dielectric structure 220 in the memory cell region 200b has, for example, a plurality of first surfaces 260a and a plurality of second surfaces 260b, wherein the first surfaces 260a are higher than the second surfaces 260b in the vertical direction.

Furthermore, the upper surfaces 290a of the dummy structures 290 in the non-memory cell region and the first surfaces 260a are substantially at the same height level. The distance d1 between two adjacent dummy structures 290 substantially equals to the distance d2 between two adjacent first surfaces 260a.

Further, there are a plurality of first concave portions 228 in the memory cell region 200b, and a plurality of second concave portions 222 between the dummy structures 290 in the non-memory cell region 200a. The bottoms of the plurality of first concave portions 228 and those of the plurality of second concave portions 222 are substantially at the same height level and with substantially the same depth. That is, the depth H1 of each of the first concave portions 228 is substantially equal to the depth H2 of each of the second concave portions 222. In addition, the distance d3 between two adjacent second concave portions 222 substantially equals to the distance d4 between two adjacent first concave portions 228.

That is, the combination structure of the dummy structures 290 and the second concave portions 222 in the non-memory cell region 200a has substantially the same configuration as the dielectric structure 220 in the memory cell region 200b.

The memory structure further comprises a word line 234, which extends across the memory cell region 200b and the non-memory cell region 200a, covers the plurality of the memory cells 250, and extends into first concave portions 228. The word line 234 has a substantially planar upper surface 234a and a non-coplanar bottom surface 234d connected to the non-coplanar dielectric structure 220 in the memory cell region 200b and the non-memory cell region 200a.

The flatness (or planarity) of the upper surface 234a of the word line 234 may be defined by the ratio of the height variation Δh2 to the linewidth of the word line 234 on the upper surface 234a of the word line 234. The ratio is, for example, 0-1.0, or 0-0.5. In addition, the height variation Δh2 of the upper surface 234a is, for example, in the range of 0 Å-300 Å.

Referring to FIG. 2C, the word line 234 in the embodiment comprises a word line head 234c and a word line body 234b, wherein the linewidth of the word line head 234c is larger than that of the word line body 234b. In addition, a patterned metal silicide layer 232a may optionally cover the word line 234 to lower its resistance. The material of the metal silicide layer 232a is, for example, tungsten silicide (WSi).

The word line head 234c is located in the non-memory cell region 200a, and the word line body 234b is located in the non-memory cell region 200a and the memory cell region 200b. The word line head 234c may be connected to an external power source (not shown) that applies voltages to the word line body 234b to operate each of the memory cells 250.

In addition, since the word line head 234c is disposed above the dummy structures 290 such that the dummy structures 290 in FIG. 2B cannot become memory cells with complete functions, the non-memory cell region 200a is a dummy memory cell region in the embodiment.

It is noted that the word line 234 in the memory structure has a substantially planar upper surface, so word line opening and linewidth necking do not easily occur.

Figure 3:
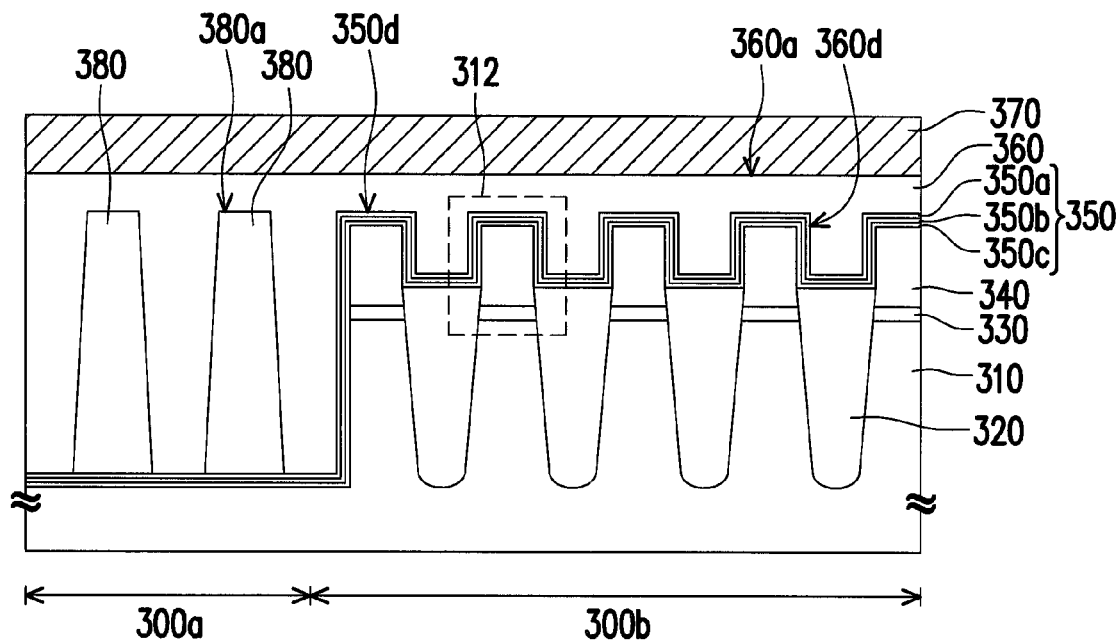
FIG. 3 is a plan view of a memory structure according to another embodiment of the invention.

FIG. 3 is a plan view of a memory structure according to yet another embodiment of the invention.

Referring to FIG. 3, the memory structure in the embodiment is a floating-gate memory. The substrate 310 of the memory structure in the embodiment can also be divided into a memory cell region 300b and a non-memory cell region 300a.

The memory cell structure comprises a plurality of memory cells 312 disposed in the memory cell region 300b, wherein a non-coplanar dielectric structure 350 is provided in the memory cells 312. The memory structure further comprises a word line 360, which extends across the memory cell region 300a and the non-memory cell region 300a and covers the plurality of memory cells 312, and has a substantially planar upper surface 360a and a non-coplanar bottom surface 360d connected to the non-coplanar dielectric structure 350 in the memory cell region 300b and non-memory cell region 300a. The memory structure can further comprise an isolation structure 320, a tunneling dielectric layer 330, a floating gate 340 and an optional metal silicide layer 370.

In addition, the memory structure can optionally comprise a plurality of dummy structures 380. Specifically, when the non-memory cell region 300a is a dummy memory cell region, there is a plurality of dummy structures 380 in the non-memory cell region 300a, wherein the upper surfaces 380a and the upper surfaces 350d are substantially at a same height level. However, when the non-memory cell region 300a is a semi-isolated region, there is no dummy structure 380.

In the embodiment, the dielectric structure 350 serves as a non-coplanar inter-poly dielectric layer, which may be formed by stacking a plurality of dielectric layers. The dielectric structure 350 comprises, for example, a bottom dielectric layer 350c, a charge-trapping layer 350b and a top dielectric layer 350a. However, the structure of the dielectric structure 350 is not limited thereto. The dielectric structure 350 may alternatively be a single layer structure.

Furthermore, for the floating-gate memory provided in the embodiment, the techniques, features and effects of manufacturing a word line with a substantially planar upper surface have already been described thoroughly in the above embodiments and are not described again.

Figure 4:
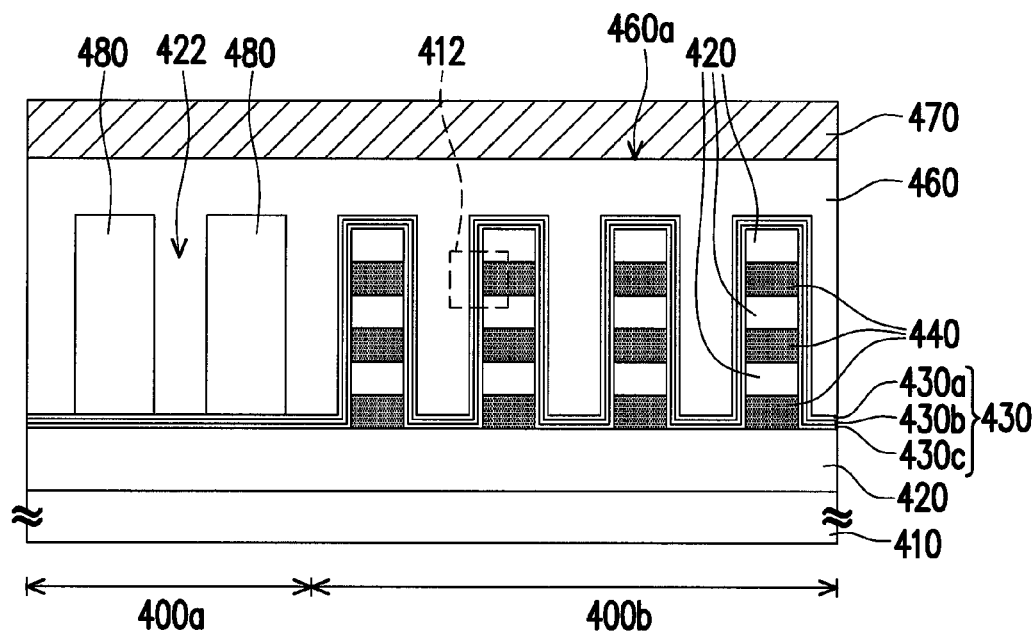
FIG. 4 is a plan view of a memory structure according to yet another embodiment of the invention.

FIG. 4 is a plan view of a memory structure according to a further embodiment of the invention. The memory structure in the embodiment is a 3D memory, of which the structure can also be divided into a memory cell region 400b and a non-memory cell region 400a.

The memory cell structure comprises a plurality of memory cells 412 disposed in the memory cell region 400b, wherein a non-coplanar dielectric structure 430 is provided in the memory cells 412. The memory structure further comprises a word line 460, which extends across the memory cell region 400a and the non-memory cell region 400a and covers the plurality of memory cells 412.

The word line 460 has a substantially planar upper surface 460a in the memory cell region 400b and non-memory cell region 400a. The memory structure can further comprise a substrate 410, an isolation layer 420, a conductive layer 440, a dielectric structure 430 and optionally a metal silicide layer 470.

In addition, the memory structure can optionally comprise a plurality of dummy structures 480. Specifically, when the non-memory cell region 400a is a dummy memory cell region, there is a plurality of dummy structures 480 in the non-memory cell region 400a with a plurality of concave portions 422 between them. The combination structure of the dummy structures 480 and the concave portions 422 has substantially the same configuration as the dielectric structure 430 in the memory cell region 400b. However, when the non-memory cell region 400a is a semi-isolated region, there is no dummy structure 480.

Furthermore, the dielectric structure 430 may be formed by stacking a plurality of dielectric layers, for example, a bottom dielectric layer 430c, a charge-trapping layer 430b and a top dielectric layer 430a.

Besides, for the 3D memory provided in the embodiment, the techniques, features and effects of manufacturing a word line with a substantially planar upper surface have already been described thoroughly in above embodiments and are not described again.

In summary, in the memory structure of the embodiments of the invention, the word line has a substantially planar upper surface in the memory cell region and the non-memory cell region, so that word-line opening and linewidth necking are prevented. In addition, the memory structures of the embodiments in the invention can be applied to different types of memory devices to improve the quality and the efficiency in the production of semiconductor memory devices.

It will be apparent to those skilled in the art that various modifications and variations could be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory structure, having a memory cell region and a non-memory cell region, and comprising:
    a plurality of memory cells comprising a plurality of first doped regions and a plurality of second doped regions disposed in the memory cell region of a substrate, wherein a plurality of first concave portions are separately present in the plurality of memory cells, one of the plurality of first doped regions is located in a top surfaces of the substrate between two adjacent first concave portions, the plurality of second doped regions is respectively located under bottom surfaces of the plurality of first concave portions, and the plurality of first doped regions and the plurality of second doped regions are at different height levels;
    a conductive material, continuously extending across the memory cell region and the non-memory cell region, covering the plurality of memory cells, extending into the plurality of first concave portions; and
    a dielectric structure located between the conductive material and the plurality of first doped regions and between the conductive material and the plurality of second doped regions, and contacted with the plurality of first doped regions and the plurality of second doped regions.

2. The memory structure according to claim 1, wherein the conductive material has a substantially planar upper surface in the memory cell region and the non-memory cell region.

3. The memory structure according to claim 1, wherein a ratio of height variation to linewidth of the substantially planar upper surface of the conductive material in the memory cell region and the non-memory cell region is 0-1.0.

4. The memory structure according to claim 3, wherein the ratio of height variation to linewidth of the substantially planar upper surface of the conductive material in the memory cell region and the non-memory cell region is 0-0.5.

5. The memory structure according to claim 1, wherein a height variation of the substantially planar upper surface of the conductive material in the memory cell region and the non-memory cell region is 0 Å-300 Å.

6. The memory structure according to claim 1, wherein the non-memory cell region is a semi-isolated region.

7. The memory structure according to claim 1, wherein the non-memory cell region is a dummy memory cell region, further comprising a plurality of dummy structures disposed in the dummy memory cell region, wherein a plurality of second concave portions are interposed between two adjacent dummy structures, and a bottom of the plurality of second concave portions and a bottom of the plurality of first concave portions are substantially at a same height level and with substantially the same depth.

8. The memory structure according to claim 7, wherein a distance between two adjacent second concave portions substantially equals to a distance between two adjacent first concave portions.

9. The memory structure according to claim 7, wherein the plurality of memory cells are vertical-channel memory cells, floating-gate memory cells or 3D memory cells.

10. A memory structure, having a memory cell region and a non-memory cell region, and comprising:
    a plurality of memory cells comprising a plurality of first doped regions and a plurality of second doped regions disposed in the memory cell region of a substrate, wherein a plurality of concave portions and a non-coplanar dielectric structure is present in the plurality of memory cells, one of the plurality of first doped regions is located in a top surfaces of the substrate between two adjacent concave portions, the plurality of second doped regions is respectively located under bottom surfaces of the plurality of first concave portions, and the plurality of first doped regions and the plurality of second doped regions are at different height levels;
    a word line, continuously extending across the memory cell region and the non-memory cell region and covering the plurality of memory cells, wherein the word line has a substantially planar upper surface and a non-coplanar bottom surface connected to the non-coplanar dielectric structure in the memory cell region and the non-memory cell region; and
    the non-coplanar dielectric structure located between the word line and the plurality of first doped regions and between the word line and the plurality of second doped regions, and contacted with the plurality of first doped regions and the plurality of second doped regions.

11. The memory structure according to claim 10, wherein a ratio of height variation to linewidth of the substantially planar upper surface of the word line in the memory cell region and the non-memory cell region is 0-1.0.

12. The memory structure according to claim 11, wherein the ratio of height variation to linewidth of the substantially planar upper surface of the word line in the memory cell region and the non-memory cell region is 0-0.5.

13. The memory structure according to claim 10, wherein a height variation of the substantially planar upper surface of the word line in the memory cell region and the non-memory cell region is 0 Å-300 Å.

14. The memory structure according to claim 10, wherein the non-memory cell region is a semi-isolated region.

15. The memory structure according to claim 10, wherein the non-coplanar dielectric structure comprises a plurality of first surfaces and a plurality of second surfaces, and the plurality of first surfaces are higher than the plurality of second surfaces.

16. The memory structure according to claim 15, wherein the non-memory cell region is a dummy memory cell region, further comprising a plurality of dummy structures disposed in the dummy memory cell region, wherein upper surfaces of the plurality of dummy structures and the plurality of first surfaces are substantially at a same height level.

17. The memory structure according to claim 16, wherein a distance between two adjacent dummy structures substantially equals to a distance between two adjacent first surfaces.

18. The memory structure according to claim 10, wherein the plurality of memory cells are vertical-channel memory cells, floating-gate memory cells or 3D memory cells.

19. A memory structure, having a memory cell region and a non-memory cell region, and comprising:
    a plurality of memory cells comprising a plurality of first doped regions and a plurality of second doped regions disposed in the memory cell region of a substrate, wherein a plurality of first concave portions are separately present in the plurality of memory cells, on of the plurality of first doped regions is located in a top surfaces of the substrate between adjacent two first concave portions, the plurality of second doped regions is respectively located under bottom surfaces of the plurality of first concave portions, and the plurality of first doped regions and the plurality of second doped regions are at different height levels;
    a conductive material, continuously extending across the memory cell region and the non-memory cell region, covering the plurality of memory cells, extending into the plurality of first concave portions; and
    a dielectric charge storage structure located between the conductive material and the plurality of first doped regions and between the conductive material and the plurality of second doped regions, and contacted with the plurality of first doped regions and the plurality of second doped regions.

* * * * *